United States Patent
Jurkiewicz et al.

(10) Patent No.: US 9,898,556 B2
(45) Date of Patent: Feb. 20, 2018

(54) IMMERSIVE DIMENSIONAL VARIATION

(75) Inventors: Andre Jurkiewicz, Livonia, MI (US);
Elizabeth Baron, Saline, MI (US); Dan Orr, Belleville, MI (US); Janice Gall, Canton, MI (US)

(73) Assignee: FORD GLOBAL TECHNOLOGY, LLC, Dearborn, MI (US)

( * ) Notice: Subject to any disclaimer, the term of this patent is extended or adjusted under 35 U.S.C. 154(b) by 338 days.

(21) Appl. No.: 13/164,254

(22) Filed: Jun. 20, 2011

(65) Prior Publication Data

US 2012/0320034 A1    Dec. 20, 2012

(51) Int. Cl.
*G06T 15/00* (2011.01)
*G06F 17/50* (2006.01)

(52) U.S. Cl.
CPC .......... *G06F 17/50* (2013.01); *G06F 17/5095* (2013.01)

(58) Field of Classification Search
CPC .............. G06F 17/50; G06F 17/30259; G06F 17/5081; G06F 17/5095; G06F 3/04812; G06T 15/00; G06T 15/005; G06T 17/00; G06T 19/20; G06T 15/08; G06T 15/10; G06T 13/40; G06T 2210/01
USPC ......................................................... 345/419
See application file for complete search history.

(56) References Cited

U.S. PATENT DOCUMENTS

| | | | |
|---|---|---|---|
| 5,583,526 A | 12/1996 | Socks et al. | |
| 6,096,086 A | 8/2000 | Weber et al. | |
| 6,113,643 A | 9/2000 | Weber et al. | |
| 6,113,644 A * | 9/2000 | Weber ................. | G06F 17/5095 345/419 |
| 6,239,809 B1 * | 5/2001 | Morioka et al. .............. | 345/422 |
| 7,069,202 B2 | 6/2006 | Stewart et al. | |
| 7,133,812 B1 * | 11/2006 | Weber et al. ..................... | 703/8 |
| 7,194,398 B2 | 3/2007 | Abe | |
| 7,761,269 B1 * | 7/2010 | Kraal et al. ....................... | 703/8 |
| 7,881,860 B2 * | 2/2011 | Noma et al. .................. | 701/117 |
| 2002/0143507 A1 * | 10/2002 | Lu et al. .......................... | 703/7 |
| 2007/0002037 A1 | 1/2007 | Kuroki et al. | |
| 2008/0294401 A1 | 11/2008 | Tsin et al. | |
| 2008/0300711 A1 | 12/2008 | Day et al. | |
| 2009/0231334 A1 * | 9/2009 | Chen ..................... | G06T 17/205 345/420 |
| 2009/0259442 A1 * | 10/2009 | Gandikota et al. ............... | 703/1 |
| 2009/0281651 A1 | 11/2009 | Knapp et al. | |

(Continued)

FOREIGN PATENT DOCUMENTS

CN    102067130 A    5/2011

OTHER PUBLICATIONS

Chinese Office Action dated Dec. 24, 2015 (15 pages).

*Primary Examiner* — Yuehan Wang
(74) *Attorney, Agent, or Firm* — Raymond L. Coppiellie; Bejin Bieneman PLC (57) ABSTRACT

A computing device is used for creating a dimensional model of at least a portion of a product, the dimensional model including a range of possible conditions with respect to at least one component in the product. The dimensional model is used to create a set of geometries for the product, a geometry being a representation of at least a portion of the product, wherein each of the geometries corresponds to one or more of the conditions. A display is provided of a first one of the geometries, and then, upon receiving an input requesting a second one of the geometries, a display is provided of the requested second one of the geometries.

20 Claims, 6 Drawing Sheets

(56) References Cited

U.S. PATENT DOCUMENTS

2010/0100365 A1 4/2010 Moriyama
2011/0074766 A1* 3/2011 Page et al. .................... 345/419

* cited by examiner

IMMERSIVE DIMENSIONAL VARIATION

BACKGROUND INFORMATION

Assembly of products having multiple parts and/or components can result in different product builds presenting dimensional variations, i.e., differences in placement, orientation, spacing, etc., of parts and/or components resulting from component manufacturing and product assembly. Dimensional variations affect not only the visual appearance and structural relationship of adjacent parts or components, but can affect the overall characteristics and quality of a product. The study of dimensional variations may be referred to as dimensional variation analysis (DVA).

Although dimensional variations can never be eliminated, particularly with respect to large and complex products such as vehicles, they can be controlled within an expected range. For example, the type of materials used in a part, expected range of dimensions of the part, a manner in which the part is attached to the product structure, and other factors may affect dimensional variations to which the parts may contribute. Accordingly, dimensional variations may be modeled to test product designs so that a product design ultimately used for manufacturing and assembly results in a product with dimensional variations that generally fall within the accepted range.

Unfortunately, mechanisms for visually representing possible dimensional variations are presently lacking.

DETAILED DESCRIPTION OF PREFERRED EMBODIMENTS

I. System Overview

Figure 1:
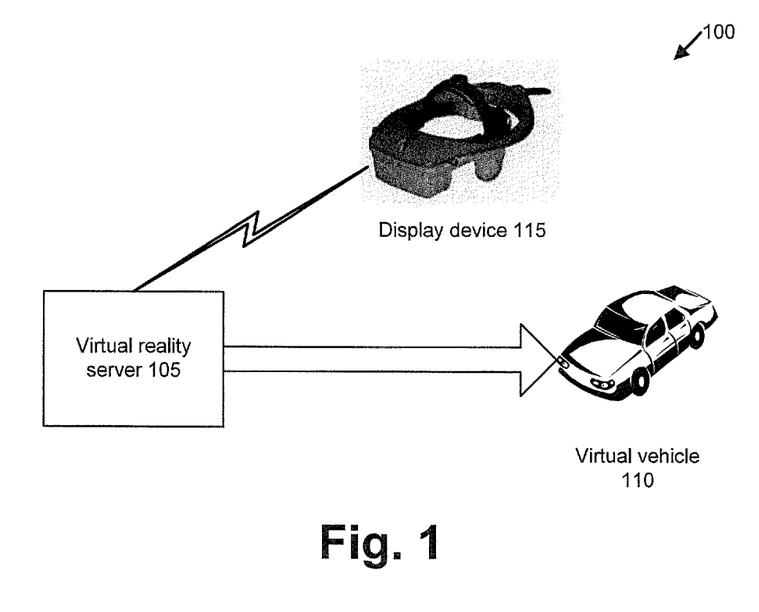
FIG. 1 illustrates an exemplary system for providing an immersive virtual reality environment.

FIG. 1 illustrates an exemplary system 100 for providing an immersive virtual reality environment. The system 100 includes a virtual reality server 105 that generates a virtual world, e.g., in monoscopic or stereoscopic format, including a virtual reality environment and a virtual product such as a virtual vehicle 110. A user may be given a view of the virtual world by using a display device 115, and can thereby interact with the virtual world including the virtual vehicle 110. The virtual world may be mapped to a physical environment.

In one implementation, the virtual reality server 105 may allow a user to view various elements or components of the virtual vehicle 110 in various combinations based on assumptions about component materials and manufacturing processes. For example, vehicle components such as a hood panel and a side panel of a vehicle body may be represented on the virtual vehicle 110. Further, a user, by selecting an option with an input device, may be able to toggle or switch between various possible configurations of the components, e.g., a first configuration showing the hood panel and the side panel with a first amount of space between them based on one set of assumptions about materials and manufacturing processes, and a second configuration showing the hood panel and the side panel with a second amount of space between them based on a second set of assumptions about materials and manufacturing processes. In this way, a large number of potential configurations may, e.g., one at a time or side-by-side, be modeled and displayed to a user.

FIG. 1 illustrates a single server 105 and a single display device 115. However, in some implementations, operations attributed herein to server 105 are performed by more than one computer server. Thus, the server 105 illustrated in FIG. 1 may represent a single virtual reality server 105 or may collectively represent virtual-reality servers 105.

Likewise, system 100 may include multiple display devices 115, although one display device 115 is illustrated in FIG. 1. Thus, the system 100 may be configured to present different perspectives of a virtual world via different display devices 115. For example, a first display device 115 could present a view of a front of a vehicle 105, and a second display device 115 could present a view of a side of a vehicle 115. For another example, a first display device 115 could be a head-mounted display worn by a user and presenting a stereoscopic view of a vehicle, and a second display device 115 could be two computer monitors, each presenting one of the two stereoscopic displays provided through the head-mounted display. In general, display device 115 may be a head-mounted virtual-reality display device presenting a stereoscopic view and possibly also audio. Alternatively or additionally, display device 115 may be a CAVE (CAVE Automated Virtual Environment), a Powerwall (i.e., a large high-resolution display wall used for projecting large computer generated images), a computer monitor such as a high definition television (HDTV), a laptop or tablet computer, etc.

Figure 2:
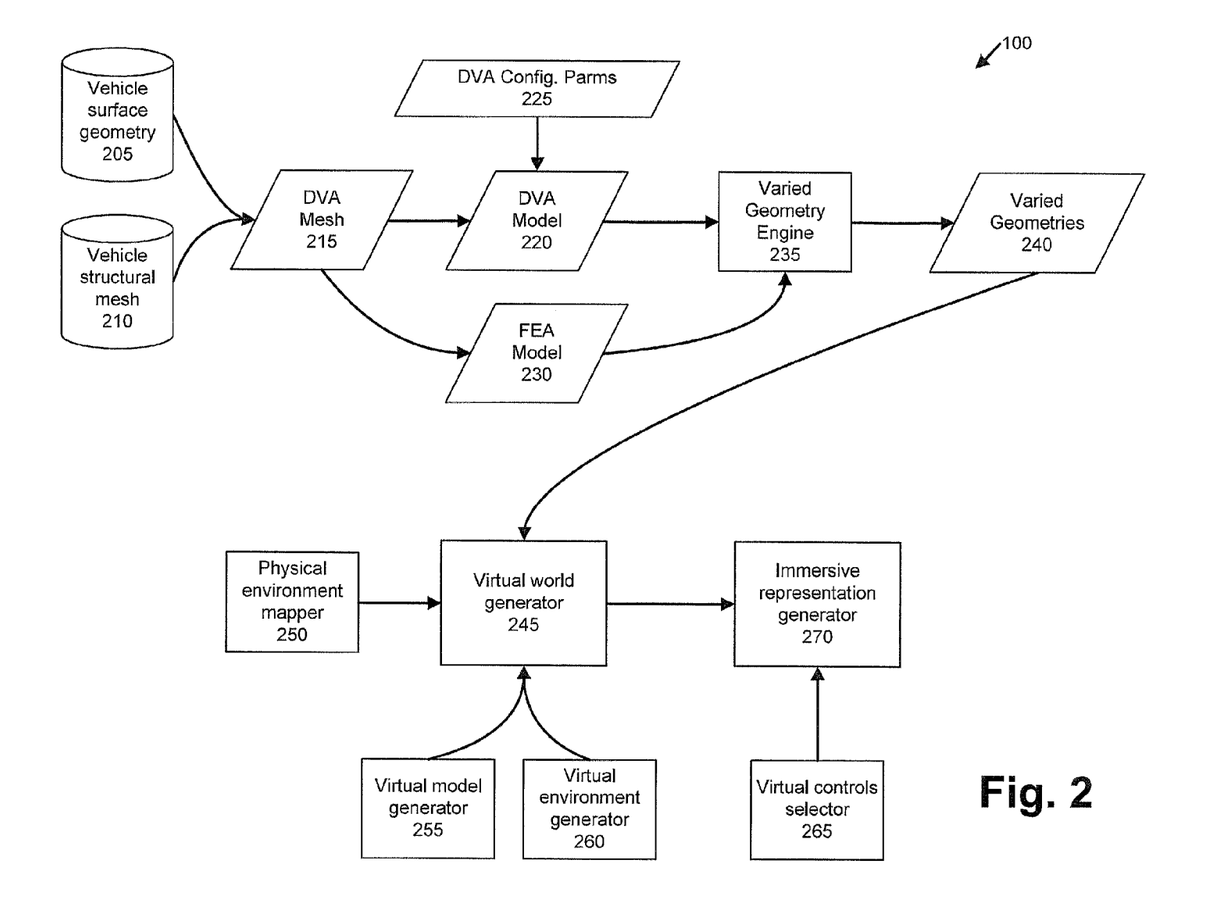
FIG. 2 illustrates further exemplary details of the system of FIG. 1, including elements for providing a virtual representation used to support evaluation of a dimensional variation analysis.

FIG. 2 illustrates further exemplary details of the system 100, including elements for providing a virtual representation used to support evaluation of a dimensional variation analysis. The system 100 is described in the context of modeling some or all of a vehicle, e.g., via a virtual vehicle 110, but it is to be understood that the systems and methods presently disclosed have application to the design and manufacturing processes of many different products and are not limited to vehicle manufacturing.

The system 100 uses vehicle geometry information from various data stores, such as a vehicle surface geometry 205 and vehicle structural mesh data 210, to generate a geometric model, or DVA mesh 215 representing vehicle structures of interest for dimensional variation analysis. The DVA mesh 215 is used to generate a DVA model 220, according to DVA configuration parameters 225. As discussed in more detail below, DVA configuration parameters 225 include factors relating to a vehicle assembly process, parts locating strategies, i.e., rules for installing parts in a vehicle structure, input tolerances, i.e., ranges of dimensional variations of respective parts and components included in the DVA mesh 215, output measurements, i.e., locations and orientations where variations between adjacent components on a vehicle are to be simulated and reported in the DVA model 220, and also output tolerances, which describe a range of permissible variation between adjacent vehicle components. Once generated, the DVA model 220 includes rules and parameters for different possible vehicle geometries, i.e., arrangements and relationships of vehicle parts and components.

System 100 further generates finite element analysis (FEA) model 230, using DVA mesh 215, and also at least some of the parameters used to generate DVA model 220, such as factors relating to the vehicle assembly process and locating strategies. In general, an FEA model takes into account internal dimensional variations possible with respect to a part, e.g., because the part is made of a flexible, stretchable, or bendable material, may vary according to material properties, e.g., Young's modulus (also known as tensile modulus), Poisson's ratio (transverse strain to longitudinal strain), etc.

A varied geometry engine 235 uses DVA model 220 and FEA model 230 to generate varied geometries 240. DVA model 220 may generally be applied to a multitude of different scenarios, i.e., a multitude of various dimensional variations between parts and/or components of a vehicle may be geometrically represented in varied geometries 240.

A virtual world generator 245 maps the varied geometries 242 a virtual model of a vehicle, generally located in a virtual environment, and sometimes mapped to a physical environment. Accordingly, in addition to varied geometries 240, virtual world generator 245 may receive input from a physical environment mapper 250, a virtual model generator 255, and/or a virtual environment generator 260.

Immersive representation generator 270 uses a virtual world generated by virtual world generator 245, along with virtual controls provided by a virtual controls selector 265, e.g., according to program instructions included in immersive representation generator 270 to provide positioning and orientation in the virtual world, to provide a user with an immersive virtual representation of a vehicle from the user's perspective.

Further, immersive representation generator 270 may provide different user perspectives a virtual world according to a user selection, e.g., via a virtual controls selector 265. For example, a user may be provided different perspectives of a virtual world according to different virtual heights of the user. That is, a user could be given a perspective of a virtual world that a 6'1" tall person would have, and then, according to a selection of a virtual controls selector 265, begin in a perspective of a virtual world that a 5'4" person would have. The ability to provide different user perspectives advantageously allows a user to experience a virtual world, and a vehicle in the virtual world, from the perspective of people with differing virtual attributes.

II. System Components

A. Surface Geometries

Figure 3A:
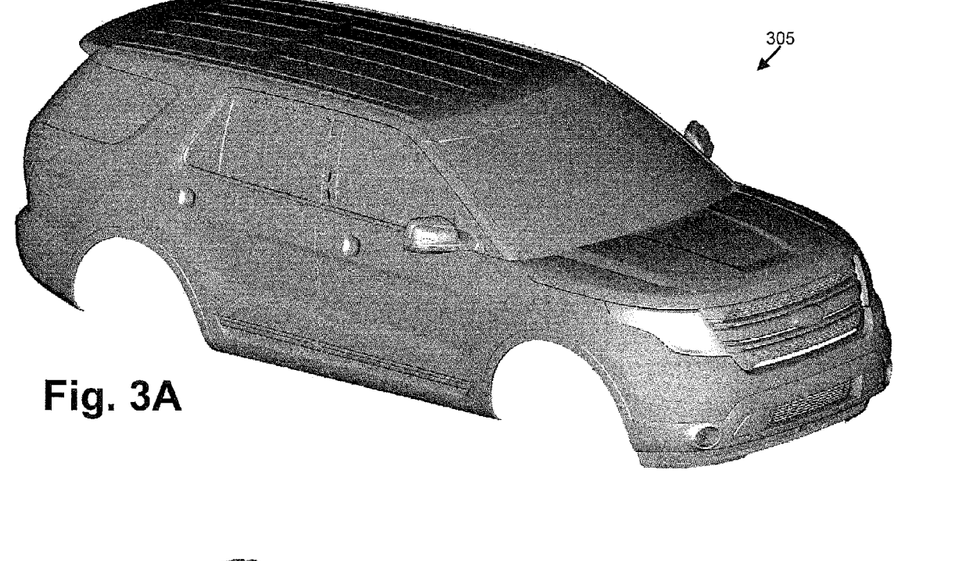
FIGS. 3A and 3B illustrate respectively an exterior vehicle surface geometry and an interior vehicle surface geometry.
Figure 3B:
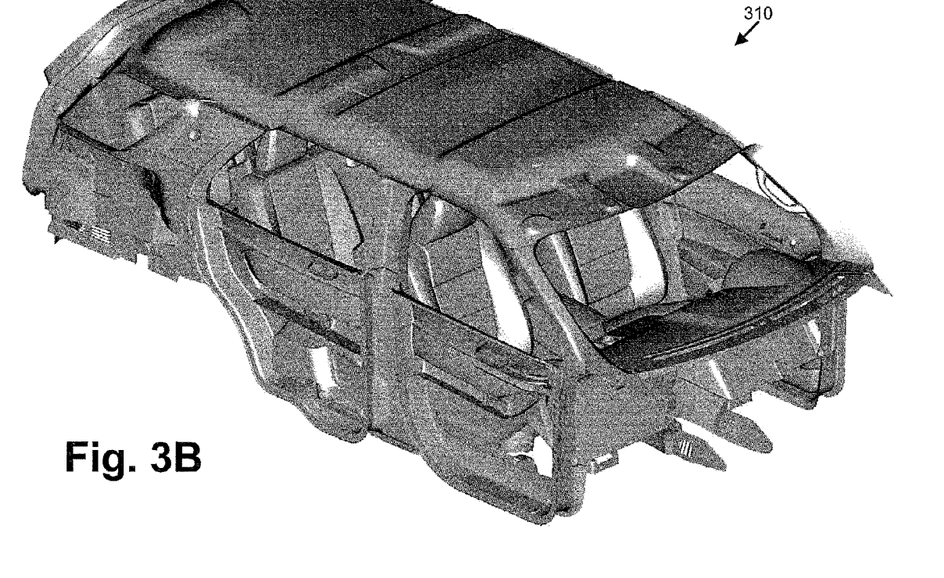

FIGS. 3A and 3B illustrate respectively an exterior vehicle surface geometry 305 and an interior vehicle surface geometry 310. In general, surface geometries define the shape, form, and dimensions of visible product, e.g. vehicle, surfaces. A class-A surface geometry, such as illustrated in FIGS. 3A and 3B, represents characteristics of curvature, tangency, and reflection quality that are aesthetically pleasing. Surface geometries are typically developed using a commercially available computer-aided design (CAD) or digital modeling software executable on a general purpose computer. Examples of commercially available CAD or digital modeling applications that may be used in developing surface geometries include: AutoStudio by Alias Systems, a subsidiary of Autodesk, Inc. of San Rafael, Calif., ICEM Surf by Dessault Systemes of France, and NX by Siemens PLM, of Germany.

Surface geometries such as geometries 305 and 310 are typically stored in what is sometimes referred to as a product data management (PDM) system that includes database system on a computer server. Examples of commercially available PDM systems include: TeamCenter Engineering by Siemens PLM, Windchill by Parametric Technology Corporation of Needham, Mass., and ENOVIA by Dessault Systemes.

Developing surface geometries is typically the first step in the geometric development of a vehicle. The production design of individual vehicle components is derived from surface geometries in either the partial form of the individual component or in the location and size of the individual component within the boundaries defined by a surface geometry.

B. Structural Mesh

Figure 4:
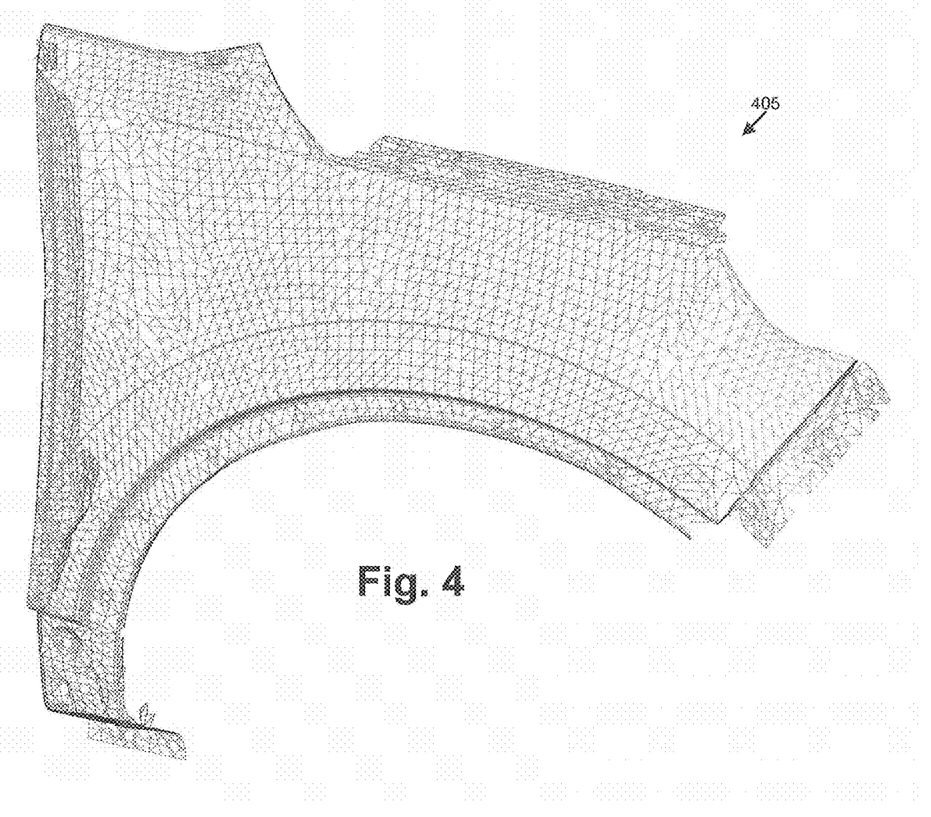
FIG. 4 illustrates an exemplary vehicle structural mesh.

FIG. 4 illustrates an exemplary vehicle structural mesh 405. The mesh 405 is what is sometimes referred to as a finite element analysis (FEA) mesh. A structural mesh 405 defines physical and material properties of the structural components of a vehicle, as opposed to surface geometries 305 and 310, which define surface characteristics of a vehicle and vehicle components. A vehicle structural mesh 405 is typically developed using commercially available FEA pre-processing software. Examples of commercially available FEA pre-processing software applications used in developing meshes 405 include Hypermesh by Altair Engineering Inc., of Troy, Mich., and Femap by Siemens PLM.

C. Dimensional Variation Analysis Mesh

Figure 5:
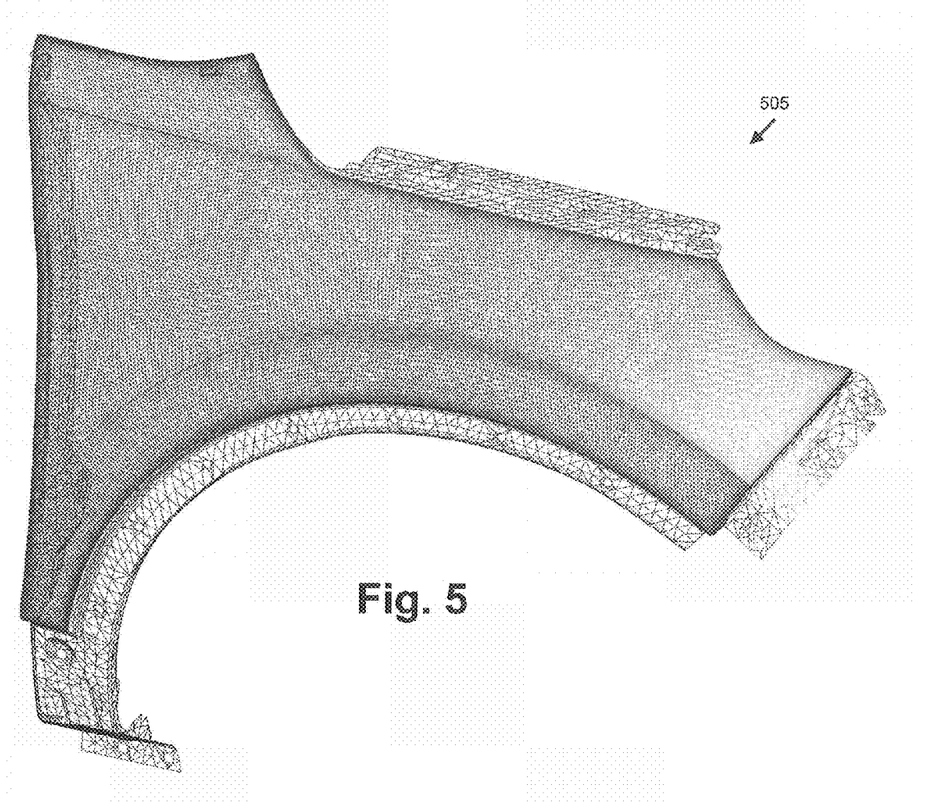
FIG. 5 illustrates an exemplary dimensional variation analysis (DVA) mesh.

FIG. 5 illustrates an exemplary dimensional variation analysis (DVA) mesh 215. As mentioned above, vehicle surface geometry 205 and vehicle structural mesh data 210 may be used to generate DVA mesh 215, which is a dimensional model representing vehicle structures of interest for dimensional variation analysis. Like vehicle structural mesh 405, the mesh 215 is generally a finite element analysis (FEA) mesh.

A DVA mesh 215 may be used in a DVA model 220 to simulate the behavior of flexible, i.e., non-rigid components in a product such as a vehicle. DVA meshes 215 define the physical and material properties of flexible components and incorporate the geometric appearance properties of surface geometries 305 and/or 310 with a mesh density appropriate for immersive virtual reality evaluation. DVA meshes 215 are typically developed using a commercially available FEA pre-processing software application on a computer system such as Hypermesh by Altair Engineering, Inc. and Femap by Siemens PLM.

D. Dimensional Variation Analysis Model

DVA Model 220 is a computer-based representation of a mechanical system used to predict the effects of tolerance accumulation, e.g., the effects of part location, stiffness, interaction with other parts, etc. A DVA model 220 may be created using a commercially available tolerance analysis software application on a computer system, such as VA (variation analysis) software offered by Siemens PLM.

A DVA model 220 is defined in a hierarchical structure. The DVA model 220 may include geometric information of the components of the mechanical system, geometric information of the component features related to tolerance accumulation, tolerance limits of the features of the components of the mechanical system related to tolerance accumulation, a sequence of operations related to assembling the mechanical system, assembly operations used to locate and constrain components within the mechanical system, linear static FEA results data files containing displacement and reaction force information for the components of the mechanical system, and the measurement operations used to calculate variation and contribution to variation of features on components within the mechanical system.

Generation of a DVA model 220 begins with creation of VA model file on a computer system. Components of a mechanical system or created within the hierarchical structure of the VA model file. Then each component within the VA model is linked to a stored file containing the geometric data set of the component, e.g., CAD data for the component.

Next, for each component within the mechanical system, attributes related to tolerance accumulation are identified. These attributes may generally be categorized into one of two types: locating/constraining attributes or measurement attributes. Locating/constraining attributes are used to create linkages between components within the mechanical system. Measurement attributes are used in the measurement of tolerance accumulation.

Next, assembly operations are identified that locate and constrain components within the mechanical system. These constraints establish tolerance path linkages between components within the mechanical system.

Finally, measurement operations are identified to calculate variation and contribution to variation between product elements for specific areas of interest, e.g., overlap between product components such as a side panel and a side panel, a headlamp and a grill, etc. The resulting DVA model 220, including tolerance accumulation attributes, measurement attributes, and assembly constraints, as well as the variation and contributions to variations resulting from measurement operations, may be used to produce varied geometries 235, as discussed further below.

E. Finite Element Analysis Model

A finite element analysis (FEA) model 230 may be generated with a commercially available FEA pre-processing software application, such as Hypermesh by Altair Engineering. An FEA model 230 may be used to run an FEA simulation of the DVA mesh 215 to produce a linear static FEA results data file. The linear static FEA results data contains geometry and constraint information, i.e., information on the displacement of the nodes (geometry) and the reaction forces at the boundary conditions (constraints). The linear static FEA results data is used to simulate the bending and twisting behavior of compliant parts in the DVA model with respect to boundary conditions, physical properties, and material properties of the parts.

Operations performed to create an FEA model 230 may be as follows. The DVA mesh 215 is imported into a Hypermesh model file using a computer system. A set of boundary conditions is created first. The set of boundary conditions are the principle locators used to constrain the DVA mesh 215 in six degrees of freedom. Subsequent load sets are created to be unit forces that represent additional constraints to further locate or over-constrain the DVA mesh 215. Next created are individual load cases of the individual load sets of unit forces with respect to the boundary conditions. For each of the individual load cases, an option may be selected to output the displacement and reaction forces for each load case. The FEA model 230 may be exported from Hypermesh as a NASTRAN (NASA Structural Analysis) ASCII (American Standard Code for Information Interchange) bulk data file in an FEA input file format such as is known.

The NASTRAN file may then be used to run the FEA model 230 to provide a results file that may be used in running the DVA model 220, as described below. For example, the process of running a FEA model is performed using a commercially available FEA solution processing software application on a computer system, such as NASTRAN by MSC Software of Santa Ana, Calif.

The FEA model 230 is generally run using a linear static solution process. Operations to run an FEA model 230 may include the following. An FEA input file, e.g., such as may be exported from Hypermesh as described above, may be selected. A run command may be invoked, whereupon partial differential equations are created, and approximate solutions to the partial differential equations are determined for the displacement of the nodes in the model, and the reaction force at the boundary conditions specified by the model. Once all equations are solved the solution processing is complete and the software applications such as NASTRAN generates a linear static FEA results data file that is stored on the computer system. This file may be used as discussed below in running DVA model 220.

F. Configuration Parameters

Various DVA configuration parameters 125 may be provided as inputs in generating a DVA model 220, including those discussed in further detail below.

1. Assembly Process

"Assembly process" refers to the sequence of assembly and assembly tooling that is used to assemble components in a product such as a vehicle. The sequence of assembly is the order in which the components are assembled. The sequence of assembly can be documented in the form of a process flow chart of components and the order in which they are assembled. Process flow charts are typically developed using commercially available computer software applications such as Powerpoint, Excel, or Visio by Microsoft Corp. of Redmond, Wash. Process flow charts are typically stored in a data file format on a computer server or PDM. The sequence of assembly can also be documented in the form of a facility and tooling layout drawing. Facility and tooling layout drawings are typically developed using commercially available computer aided design (CAD) applications such as AutoCAD by AutoDesk.

The assembly tooling consists of: geometry setting fixtures, operator load-assist devices, joining equipment, and fastening equipment. The assembly tooling, in the form of the design of the assembly tooling, is typically developed using commercially available CAD applications such as Catia by Dessault Systemes, NX by Siemens PLM, or AutoCAD by AutoDesk; or some other software application.

2. Locating Strategy

Locating strategy refers to the features of a component that are used to position and constrain that component as it is assembled in a product such as a vehicle. The features identified as the being a part of the locating strategy are either engaged an assembly tool or engaged by adjacent component features that have been assembled to the vehicle. The locating strategy can be documented in the form of a generic standard locating strategy or a vehicle specific component locating strategy.

A generic standard locating strategy is typically documented using a commercially available computer software application such as Powerpoint or Visio by Microsoft. The generic standard locating strategy is typically the basis for developing the vehicle specific component locating strategy.

A vehicle specific component locating strategy is typically developed using a commercially available CAD application such as Catia by Dessault Systemes or I-DEAS by Siemens PLM; or using some other software application.

3. Input Tolerances

Input tolerances describe limits of permissible variations specified for a component feature with respect to the component locating strategy, limits of permissible variation specified for a dimension between component features, and/or limits of permissible variation specified between component locating features at stages of the assembly process. Input tolerances are typically documented and communicated in accordance with the ASME Y14.5 Dimensioning and Tolerancing Standard, promulgated by ASME (founded as the American Society of Mechanical Engineers) of New York, N.Y.). In accordance with the ASME Y14.5 standard, the limits of permissible variation can be expressed in the form of geometrical tolerances, limit tolerances, or plus-minus tolerances.

Input tolerances may be documented in a generic standard that applies to specific vehicle component designs, or documented explicitly on a CAD model as annotation for that specific vehicle component. Input tolerances in a generic standard are typically documented using commercially available computer software applications such as Microsoft Excel or Word. Input tolerances on a CAD model as annotation are typically developed using a commercially available CAD application such as Catia by Dessault Systemes or I-DEAS by Siemens PLM.

4. Output Measurements

Output measurements describe a location and orientation, between adjacent components on a product such as a vehicle, where variation will be simulated and reported in the DVA model 220. Output measurements may be provided by placing a vehicle and/or vehicle parts into an XYZ coordinate system. Output measurements are typically defined using a planning document. For example, an exterior coordinate cut plane (CCP) drawing and interior CCP drawing may be used to document the location and orientation, in the XYZ coordinate system, between adjacent components on a vehicle, where variation will be simulated and reported in the DVA model 220. The CCP may also serve other purposes related to component measurement planning and pre-production and production inspection planning CCP drawings are typically developed using commercially available computer software applications such as Powerpoint or Visio by Microsoft; or commercially available CAD applications such as Catia by Dessault Systemes or I-DEAS by Siemens PLM.

5. Output Tolerances

Output tolerances describe the limit of permissible variation specified between adjacent component features. In contrast to input tolerances, which describe possible variations in components, or in component locations during assembly process, output tolerances describe desired ranges of variation with reference to an XYZ coordinate system. That is, input tolerances may be accumulated with respect to various factors that can affect the component, e.g., component variations, locations, etc., and then compared to output tolerances to determine if variations measured by input tolerances are within a permissible range.

Output tolerance limits are typically expressed using plus-minus tolerance values. Exterior output tolerances may be developed using a system requirements document such as a surface requirement illustration document. The surface requirement illustration document is typically developed using a commercially available computer software application such as Powerpoint or Excel by Microsoft. Interior output tolerances may be developed using what may be referred to as a fit-and-finish document. The fit-and-finish document is typically developed using a commercially available computer software application such as Powerpoint or Excel by Microsoft. Both the surface requirement illustration document and the fit-and-finish document describe permissible variations at various locations of a product such as a vehicle, e.g., a gap between a hood and a side panel may be 4.5 millimeters plus or minus 2 millimeters, etc.

G. Varied Geometry and Varied Geometry Engine

Varied geometry engine 235 accepts as inputs a DVA model 220 and FEA model 230 to generate a plurality of varied geometries 240. The plurality of varied geometries 240 results from running DVA model 220 in the varied geometry engine 235. Each varied geometry 240 represents a set of possible conditions with respect to a product such as a vehicle. For example, varied geometry engine 235 may select different tolerance values for different vehicle components included in the DVA model 220 to generate various varied geometries 240. Generally, the simulations provided by varied geometries 240 are generated by applying a Monte Carlo (i.e., random number) generation technique within a range of tolerances to values within range is provided by the DVA model 224 various vehicle components. As discussed below, varied geometries 240 are provided as input to virtual world generator 245.

DVA model 220 may be run by a commercially available tolerance analysis software application on a computer system, such as VA by Siemens PLM. The DVA model 220 is typically run with a simulation of variation, i.e., how much a component may vary in position, and a simulation of contribution, i.e., how much a component contributes to a part's or product's overall variation in position. As mentioned above, the simulation of variation may be performed using a Monte Carlo technique to apply random variation to all toleranced features.

Accordingly, running a DVA 220 model may include the following operations. A DVA model 220 may be imported into the appropriate software application for running the model 220, e.g., VA, mentioned above. A selection may be made to run Monte Carlo simulations. Upon invoking the run command, the software application generally initializes the model 220 which includes reading information in the FEA results data file to create a stiffness matrix for the flexible components in the model. Then some or all of the following may be used to calculate variation and contribution to variation of features on components within the mechanical system: the stiffness matrix, geometric information of the component features related to tolerance accumulation, tolerance limits of the features of the components of the mechanical system related to tolerance accumulation, the sequence of operations related to assembling the mechanical system, the assembly operations used to locate and constrain components within the mechanical system, and the measurement operations.

Non-nominal geometry is exported, i.e., as a varied geometry 240, during the variation simulation as samples produce a result for a measurement operation that is defined as a condition for exporting the non-nominal geometry. That is, the software application running the model 220 may be configured to generate varied geometries 240 upon conditions related to certain ranges of variation of certain parts, a certain number of variations within a given range, etc. A goal of running the model 220 is to generate a number of varied geometries 240 to allow for meaningful evaluation of possible variations in a product as is manufactured, but not to generate so many varied geometries 240 as to present variations that are too close together to be useful, or are too many to evaluate. In any event, the non-nominal geometry is stored on the computer system where the DVA model 220 is being run as a varied geometry 240.

H. Virtual World Generator

In addition to varied geometries 240, virtual world generator 245 receives inputs from physical environment mapper 150, virtual model generator 155, and virtual environment generator 260. Virtual world generator 245 in turn provides a virtual reality environment to immersive representation generator 270, which allows a user to select different views of a product such as a vehicle using controls provided by virtual controls selector 265, based on varied geometries 240. As mentioned elsewhere herein, certain elements disclosed in this specification may be implemented according to computer executable instructions stored on a computer readable medium. For example, some or all of the elements described in this paragraph, such as virtual world generator 245, may be provided according to computer executable instructions stored and executed on virtual reality server 105.

I. Physical Environment Mapper

Physical environment mapper 250 is an optional component that is used to register a virtual reality coordinate system to real world, i.e., physical, objects. For example, a vehicle mockup may be provided with various points such as seats, a dashboard, steering wheel, instrument panel, etc. Accordingly, to allow a user of display device 115 to interact with the virtual world provided by virtual world generator 245 and immersive representation generator 270, physical environment mapper 250 may be used to map points in a physical mockup of a vehicle to a coordinate system used by the virtual world generator 245. For example, points may be oriented with respect to the ground, and may include vehicle points based on vehicle dimensions such as height of the vehicle from the ground, height of doors, interior width at various points, etc. Further, coordinate system used by physical environment mapper 250 may include a mechanism for scaling a virtual world to properly mapped to the coordinate system for the physical world.

J. Virtual Model Generator

Virtual model generator 255 provides a virtual model of a product such as a vehicle so that a complete product model may be provided in the virtual world generated by virtual world generator 240. That is, varied geometries 240 generally only feature areas of interest on a product, i.e., a subset of the product, whereas for a complete virtual reality experience it is desirable to provide a substantially complete rendering of a product. Virtual model generator 255 makes use of what is sometimes referred to as a nominal geometry, i.e., a geometry that provides all of the basic elements of a product such as a vehicle. Further, virtual model generator 255 may use what is sometimes referred to as an appearance database, i.e., a data store of various textures, shaders, etc., that may be applied to a product such as a vehicle. For example, a vehicle may be modeled with leather seats and a tan interior, cloth seats and a black interior, etc. Numerous different components of a vehicle may have different textures, colors, etc. In addition, the nominal geometry includes coordinate information for various product components.

K. Virtual Environment Generator

Virtual environment generator 260 is used to generate aspects of a virtual world other than a product, e.g., a vehicle, representation. For example, virtual environment generator 260 receives input with respect to lighting in a virtual world, illustrates shadows and reflections, and provides perspective. With respect to lighting, ray tracing, which calculates how light bounces from one surface to another, may be important, and may enhance a virtual representation. With respect to perspective, virtual environment generator 260 may provide a perspective for a person of a certain height. As mentioned above, immersive representation generator 270 may make available different perspectives in a virtual environment.

In addition, virtual environment generator 260 may control what is sometimes referred to as a variation mapping. That is, different varied geometries 240 may be selected to be applied to a virtual model created by virtual model generator 255. Further, different virtual models, e.g., according to different nominal geometries, may be provided by virtual model generator 255 and mapped to different varied geometries 240.

L. Virtual Controls Selector

Virtual controls selector 265 provides a mechanism for selecting controls of an input device, e.g., keyboard, mouse, pointing device, etc., that can be used to select various events in the virtual world provided by virtual world generator 245. For example, various keys of the keyboard may be mapped to toggle the display of different varied geometries in the virtual world. A first varied geometry may represent a first positioning of a product components, such as a side panel, while a second varied geometry may represent a second positioning of the side panel. A key of a keyboard may be selected to toggle between the first and second varied geometries to allow a user of the virtual reality system 100 to evaluate the difference in product appearance represented by the first varied geometry and the second varied geometry.

L. Immersive Representation Generator

Immersive representation generator 270 combines the virtual world provided by virtual world generator 245 with virtual controls provided by virtual controls selector 270, taking into account the location of the user within the virtual world, and the continuously updated position and orientation of the view of the user in the physical world, to provide an immersive representation of a product such as a vehicle. Accordingly, a user, e.g., using display 115, can experience the generated virtual world, and can control aspects of the virtual world using provided virtual controls. The representation is described as immersive because the user generally has no other visual experience other than a view of the virtual world provided by the system 100.

III. Process Flow

Figure 6:
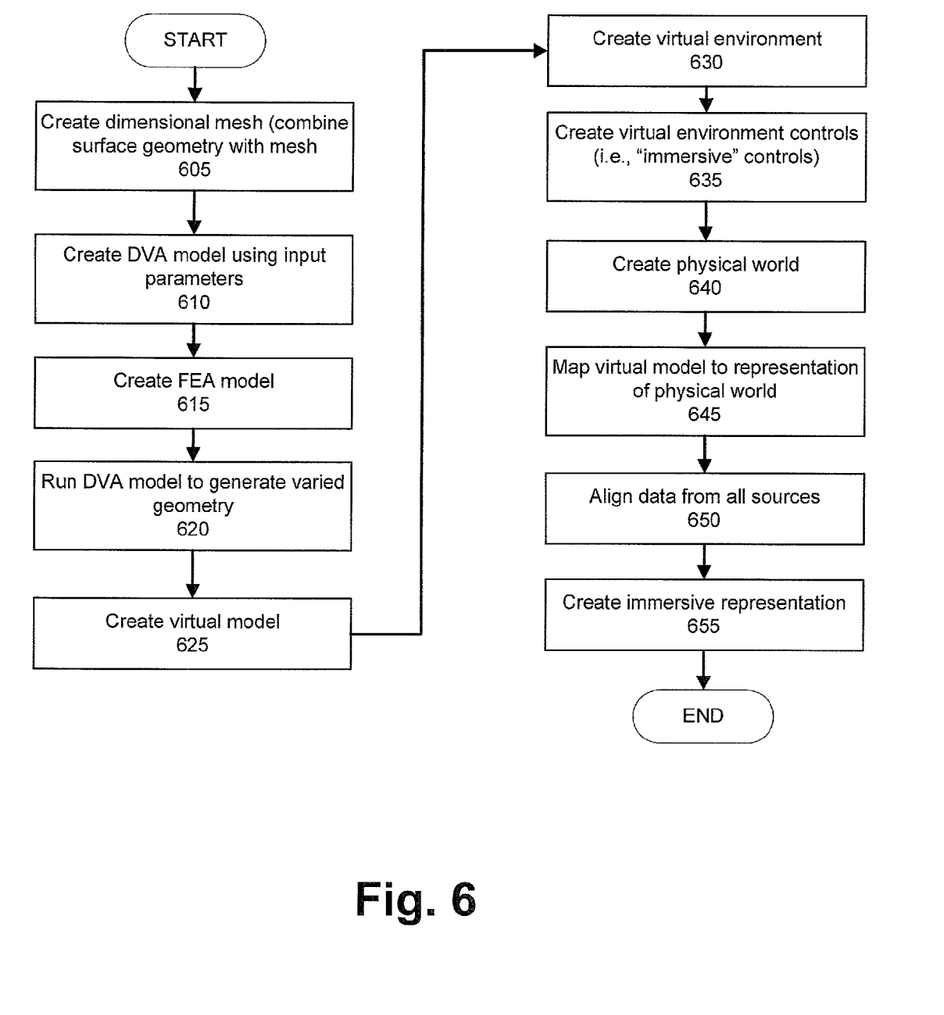
FIG. 6 illustrates an exemplary process for creating and using an immersive virtual environment including evaluation of varied geometries.

FIG. 6 illustrates an exemplary process 600 for creating and using an immersive virtual environment including evaluation of varied geometries 240.

The process 600 begins in a step 605, in which DVA mesh 215 is created by a combination of surface geometry 205 and structural mesh 210. As mentioned above, the DVA mesh 215 generally represents a portion of a product such as a vehicle, e.g., a side of a vehicle, a front-end, a portion of interior, or some other area or set of components of interest.

Next, in step 610, a DVA model 220 is created from the DVA mesh 215 using configuration parameters 225. As discussed above, DVA model 220 includes a dimensional model of at least a portion of a product, e.g., a vehicle, and includes a range of possible conditions with respect to at least one component, and generally a plurality of components, in the product.

Next, in step 615, the DVA mesh 215 is used to create an FEA model 230.

Next, in step 620, varied geometry engine 235 is used to run the DVA model 220, using the FEA model 230, to create varied geometries 240. Thus, the dimensional model represented by DVA model 220 is used to create a set of geometries, e.g., varied geometries 240, for the product, where a varied geometry 240 is a representation of at least a portion of the product, wherein each of the geometries corresponds to one or more of the conditions included in the DVA model 220 as discussed above.

Next, in step 625, virtual model generator 255 is used to create a virtual model of a product, e.g., a vehicle. That is, as mentioned above, DVA model 220 generally includes only a portion of a vehicle, and therefore virtual model generator 215 is used to create a complete vehicle model for use in a virtual world.

Next, in step 630, virtual environment generator 260 is used to create a virtual environment in which the model created in step 625 may be included.

Next, in step 635, virtual controls selector 265 is used to create virtual environment controls, sometimes referred to as immersive controls, for use when viewing a virtual model of a vehicle.

Next, in step 640, physical environment mapper 250 is used to match a physical world associated with the virtual environment created in step 630. That is, a coordinate system is imposed on a physical environment with points that may be mapped to the virtual environment.

Next, in step 645, physical environment mapper 250 maps the physical world to the virtual environment. Note that, as mentioned above, mapping the virtual environment to a physical environment is optional, and may be omitted in some implementations.

Next, in step 650, virtual world generator 245 aligns all data to be included in the virtual world. For example, after the physical world is mapped to the virtual environment, the virtual model generated as discussed with respect to step 625 must be placed in the virtual environment. Further, immersive controls used to toggle various views in the virtual world must be mapped to the coordinates, and the varied geometries 240 associated with the immersive controls.

Next, in step 655, immersive representation generator 270 generates an immersive representation that may be experienced by a user of display 115 and/or virtual reality server 105, server 105 including instructions such as those mentioned above for tracking position and/or orientation. For example, generator 260 may provide a virtual representation of a vehicle that includes a first one of the varied geometries 240 generated as described above in step 620, and then, upon receiving an input requesting a second one of the geometries 240 generated as described above in step 620, may display the requested second one of the geometries 240.

Following step 655, the process 600 ends.

IV. Conclusion

Computing devices such as virtual reality server 105, etc. may employ any of a number of computer operating systems known to those skilled in the art, including, but by no means limited to, known versions and/or varieties of the Microsoft Windows® operating system, the Unix operating system (e.g., the Solaris® operating system distributed by Oracle Corporation of Redwood Shores, Calif.), the AIX UNIX operating system distributed by International Business Machines of Armonk, N.Y., the Linux operating system, Apple OS-X Operating Systems, and/or Mobile Operating Systems. Computing devices may include any one of a number of computing devices known to those skilled in the art, including, without limitation, a computer workstation, a desktop, notebook, laptop, tablet computer, smartphone, or handheld computer, or some other computing device known to those skilled in the art.

Computing devices such as the foregoing generally each include instructions executable by one or more computing devices such as those listed above. Computer-executable instructions may be compiled or interpreted from computer programs created using a variety of programming languages and/or technologies known to those skilled in the art, including, without limitation, and either alone or in combination, Java™, C, C++, Visual Basic, Java Script, Perl, etc. In general, a processor (e.g., a microprocessor) receives instructions, e.g., from a memory, a computer-readable medium, etc., and executes these instructions, thereby performing one or more processes, including one or more of the processes described herein. Such instructions and other data may be stored and transmitted using a variety of known computer-readable media.

A computer-readable medium includes any medium that participates in providing data (e.g., instructions), which may be read by a computer. Such a medium may take many forms, including, but not limited to, non-volatile media, volatile media, and transmission media. Non-volatile media include, for example, optical or magnetic disks and other persistent memory. Volatile media include dynamic random access memory (DRAM), which typically constitutes a main memory. Transmission media include coaxial cables, copper wire and fiber optics, including the wires that comprise a system bus coupled to the processor. Transmission media may include or convey acoustic waves, light waves and electromagnetic emissions, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH-EEPROM, any other memory chip or cartridge, a carrier wave as described hereinafter, or any other medium from which a computer can read.

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claimed invention.

Accordingly, it is to be understood that the above description is intended to be illustrative and not restrictive. Many embodiments and applications other than the examples provided would be apparent to those of skill in the art upon reading the above description. The scope of the invention should be determined, not with reference to the above description, but should instead be determined with reference to the appended claims, along with the full scope of equivalents to which such claims are entitled. It is anticipated and intended that future developments will occur in the arts discussed herein, and that the disclosed systems and methods will be incorporated into such future embodiments. In sum, it should be understood that the invention is capable of modification and variation and is limited only by the following claims.

All terms used in the claims are intended to be given their broadest reasonable constructions and their ordinary meanings as understood by those skilled in the art unless an explicit indication to the contrary in made herein. In particular, use of the singular articles such as "a," "the," "said," etc. should be read to recite one or more of the indicated elements unless a claim recites an explicit limitation to the contrary.

What is claimed is:

1. A computer, programmed to:
   randomly generate a plurality of geometries that each include a first component, each of the geometries corresponding to a respective position of the first component with respect to a second component in a product that comprises the first and second components;
   provide to a display a three-dimensional view of the product according to a three-dimensional coordinate system, the three-dimensional view including the first and second components, wherein the first component is displayed according to a first one of the geometries;
   provide to the display a continuously updated position and orientation of the three-dimensional view of the product according to a current physical location of a user in the three-dimensional coordinate system, whereby the position and orientation of the three-dimensional view of the product in the three-dimensional coordinate system, including the first and second components, changes as the current physical location of the user changes; and
   upon receiving input requesting a second one of the geometries, provide to the display the continuously updated position of the three-dimensional view of the product modified according to the second one of the geometries.

2. The computer of claim 1, wherein the three-dimensional view of the product includes substantially all of the product.

3. The computer of claim 2, further programmed to:
   map a physical space including real physical objects to the virtual coordinate system; and
   provide the three-dimensional view of the product so as to incorporate the real physical objects into the three-dimensional view of the product.

4. The computer of claim 1, wherein the product is a vehicle.

5. The computer of claim 1, further programmed to:
   receive an input requesting a third one of the geometries while the second one of the geometries is being displayed; and
   upon receiving input requesting the third one of the geometries, provide to the display the continuously updated position of the three-dimensional view of the product modified according to the third one of the geometries.

6. The computer of claim 1, further comprising at least one display device configured to receive the display the three-dimensional view of the product.

7. The computer of claim 1, wherein parameters used in creating the geometries include at least one of: factors relating to a vehicle assembly process, parts locating strategies, input tolerances, output measurements, and output tolerances.

8. The computer of claim 1, further programmed to randomly generate the geometries based on linear static finite elements analysis results data files containing displacement and reaction force information for the at least one component in a mechanical system, and measurement operations used to calculate variation and contribution to variation of features on the at least one component within the mechanical system.

9. The computer of claim 1, wherein each of the geometries is based on dimensional mesh data that is generated from product surface geometry data and product structural mesh data.

10. The computer of claim 9, wherein each of the geometries is generated according to one or more conditions in a range of one or more conditions of the first component.

11. A method, comprising:
    randomly generating a plurality of geometries that each include a first component, each of the geometries corresponding to a respective position of the first component with respect to a second component in a product that comprises the first and second components;
    providing a display of a three-dimensional view of the product according to a three-dimensional coordinate system, the three-dimensional view including the first and second components, wherein the first component is displayed according to a first one of the geometries;
    providing in the display a continuously updated position and orientation of the three-dimensional view of the product according to a current physical location of a user in the three-dimensional coordinate system, whereby the position and orientation of the three-dimensional view of the product in the three-dimensional coordinate system, including the first and second components, changes as the current physical location of the user changes; and
    upon receiving input requesting a second one of the geometries, providing in the display the continuously updated position of the three-dimensional view of the product modified according to the second one of the geometries.

12. The method of claim 11, wherein the three-dimensional view of the product includes substantially all of the product.

13. The method of claim 11, further comprising:
    mapping a physical space including real physical objects to the virtual coordinate system; and
    providing the three-dimensional view of the product so as to incorporate the real physical objects into the three-dimensional view of the product.

14. The method of claim 11, wherein the product is a vehicle.

15. The method of claim 11, further comprising:
    receiving an input requesting a third one of the geometries while the second one of the geometries is being displayed; and
    upon receiving input requesting the third one of the geometries, providing in the display the continuously updated position of the three-dimensional view of the product modified according to the third one of the geometries.

16. The method of claim 11, further comprising providing at least one display device configured to receive the display the three-dimensional view of the product.

17. The method of claim 11, wherein parameters used in creating the geometries include at least one of: factors relating to a vehicle assembly process, parts locating strategies, input tolerances, output measurements, and output tolerances.

18. The method of claim 11, further comprising randomly generating the geometries based on linear static finite elements analysis results data files containing displacement and reaction force information for the at least one component in a mechanical system, and measurement operations used to calculate variation and contribution to variation of features on the at least one component within the mechanical system.

19. The method of claim 11, wherein each of the geometries is based on dimensional mesh data that is generated from product surface geometry data and product structural mesh data.

20. The method of claim 19, wherein each of the geometries is generated according to one or more conditions in a range of one or more conditions of the first component.

* * * * *